Figures 1A, 1B:
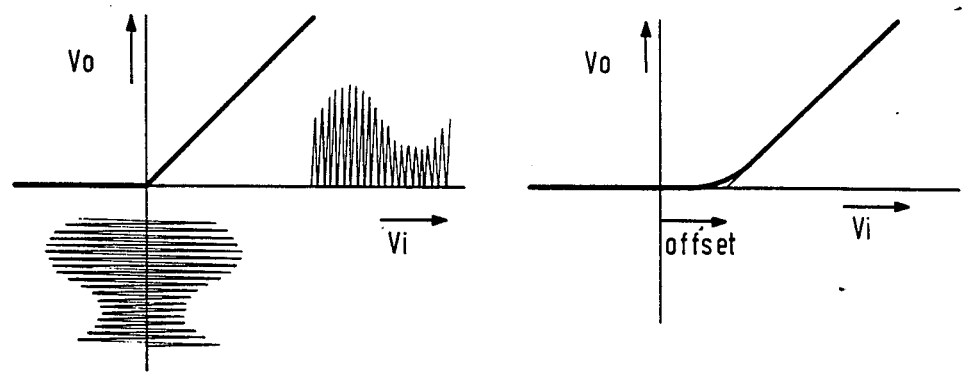

United States Patent [19]

Straver et al.

[11] Patent Number: 4,890,066
[45] Date of Patent: Dec. 26, 1989

[54] ENVELOPE DETECTOR

[75] Inventors: Willibrordus G. M. M. Straver, Nootdorp; Ernst H. Nordholt, Berkel en Rodenrijs, both of Netherlands

[73] Assignee: U.S. Philips Corporation, New York, N.Y.

[21] Appl. No.: 238,011

[22] Filed: Aug. 29, 1988

[30] Foreign Application Priority Data

Sep. 21, 1987 [NL] Netherlands .................. 8702246

[51] Int. Cl.$^4$ .................. H03D 1/18; H03D 1/06; H03K 9/02
[52] U.S. Cl. .................. 329/369; 329/370; 329/349; 455/312
[58] Field of Search .................. 329/101, 102, 104, 109, 329/132, 133, 135, 166, 168, 169, 192, 203, 204, 206; 455/309, 312

[56] References Cited

U.S. PATENT DOCUMENTS 3,904,989  9/1975  Cordell .......................... 331/34
4,553,102  11/1985  Yoshida .......................... 329/133

FOREIGN PATENT DOCUMENTS 8141010  8/1983  Japan .

Primary Examiner—David Mis
Attorney, Agent, or Firm—Algy Tamoshunas; Marianne R. Rich

[57] ABSTRACT

Envelope detector comprising a differential amplifier (A), a full-wave rectifier circuit and a smoothing filter (AF), which differential amplifier (A) converts an input voltage into a pair of current signals in phase opposition and which full-wave rectifier circuit comprises a pair of half-wave rectifiers (HWR1, HWR2) for half-wave rectifying the said pair of current signals, coupled to a first combining stage (S) for combining the output signals of the two half-wave rectifiers (HWR1, HWR2) with like polarity, which first combining stage (S) supplies a full-wave rectified signal. In order to reduce d.c. offsets, the detector comprises a frequency-dependent negative feedback loop which comprises a second combining stage (D) coupled to the outputs ($R_{o1}$, $R_{o2}$) of the pair of half-wave rectifiers (HWR1, HWR2) for combining the output signals of the pair of half-wave rectifiers (HWR1, HWR2) with opposite polarity, said second combining stage (D) being negatively fed back to the input ($I_c$) of the differential amplifier (A) via a low-pass filter (LPF) for a selection of the d.c. component.

4 Claims, 2 Drawing Sheets

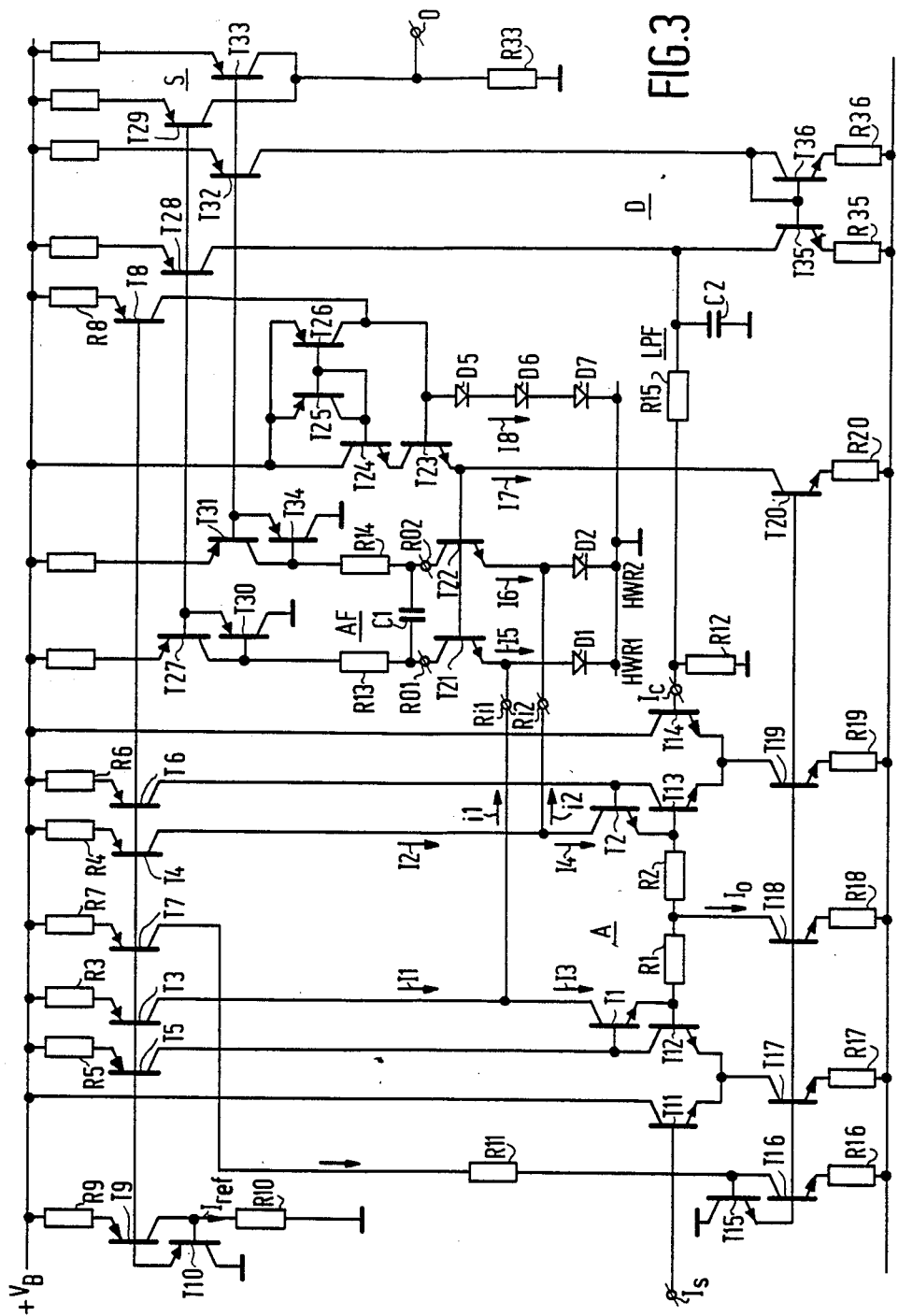

ENVELOPE DETECTOR

The invention relates to an envelope detector comprising a differential amplifier, a full-wave rectifier circuit and a smoothing filter, said differential amplifier converting an input voltage into a pair of current signals in phase opposition, said full-wave rectifier circuit comprising a pair of half-wave rectifiers for half-wave rectifying the said pair of current signals, coupled to a first combining stage for combining the output signals of the two half-wave rectifiers with like polarity.

An envelope detector of this type is known from the published British patent application No. 2,120,028 and can be used for AM detection.

In the known envelope detector the differential amplifier is provided with a negative feedback loop for the purpose of accurate gain. This differential amplifier supplies a pair of current signals in phase opposition via a current mirror circuit to the bases of a pair of rectifier transistors. The rectifier transistors each function as halfwave rectifiers and are biased by means of a bias voltage source in such a way that, dependent on the direction or polarity of the said signal currents, they are alternately turned on and alternately half-wave rectify the two signals currents. The emitter outputs of these rectifier transistors are connected to a common node functioning as the aforementioned first combination stage. The half-wave rectified signal currents are added with like polarity in this stage, which results in a full-wave rectified signal. A selection of the amplitude modulation signal from this full-wave rectified signal is obtained by means of the said smoothing filter which is connected to the said common emitter node in the known envelope detector.

For a correct AM detection the output signal of each of the half-wave rectifiers is to be zero for one of the two polarities (for example the negative polarity) of the input signal and should vary proportionally with the input signal for the other (positive) polarity, as is shown, for example in FIG. 1A. However, this desired unilaterally proportional detection characteristic is disturbed in practice by ambient factors, parasitic effects, etc. As a result non-linearities and a d.c. offset in the detection characteristic of the known envelope detector as shown, for example in FIG. 1B are produced, which results in a signal distortion, which is inadmissibly large particularly in the case of small input signals.

It is an object of the invention to reduce the signal distortion of an envelope detector.

According to the invention, an envelope detector of the type described in the opening paragraph is therefore characterized by a frequency-dependent negative feedback loop which has a second combining stage coupled to the outputs of the pair of half-wave rectifiers for combining the output signals of the pair of half-wave rectifiers with opposite polarity, said second combining stage being negatively fed back to the input of the differential amplifier via a low-pass filter for a selection of the d.c. component.

The invention is based on the recognition that the unwanted d.c. offset in the known envelope detector becomes manifest in the d.c. level of the difference between the half-wave rectified signals of the half-wave rectifiers if these signals occur with like polarity, or in the d.c. level of the sum of the last-mentioned signals if they occur with opposite polarity.

When using the measure according to the invention, the output signals of the two half-wave rectifiers are combined in the second combining stage, possibly after filtering in the smoothing filter, which combination is opposed to that in the first combination stage, that is to say, the signals are either added if a subtraction is effected in the first combining stage or they are subtracted if an addition is effected in the first combining stage. By selecting the d.c. component from the output signal of the second combining stage and negatively feeding it back to the input of the differential amplifier, a d.c. negative feedback takes place, which results in a reduction of the total unwanted d.c. offset occurring in the envelope detector. As a result, the signal distortion, even when rectifying and detecting very small AM signals, is acceptably small.

A preferred embodiment of the envelope detector according to the invention is characterized in that the pair of half-wave rectifiers is constituted by a diode pair which is arranged in the direction of conductivity between a pair of current outputs of the differential amplifier and ground, and whose diodes are fed with mutually equal diode bias currents.

When using this measure, the diode bias currents may be chosen to be very small so that also the voltage variation across the diodes is small and so-called "slewing" effects do not occur or hardly occur, whilst a correct half-wave rectification of each of the two signal currents of the differential amplifier is obtained.

Another preferred embodiment of the envelope detector according to the invention is characterized in that the differential amplifier comprises a transistor pair whose bases are coupled to an input terminal pair of the differential amplifier, whose emitters are connected via first and second emitter resistors, respectively, to a common emitter current source and whose collectors are coupled via first and second collector current sources, respectively, to a power supply voltage and to the pair of half-wave rectifiers, said current sources being coupled via a current mirror arrangement to a common reference current, said current mirror arrangement comprising a current bias circuit for biassing the current of the emitter current source at the sum value of the currents of the said two collector current sources.

When using this measure, the two current signals applied to the half-wave rectifiers are prevented from comprising a noticeable common mode component which may disturb the detection of the d.c. component to be negatively fed back.

A practical embodiment of the envelope detector according to the invention is preferably characterized by a transistor pair whose emitters are coupled to the diodes of the said diode pair, whose bases are coupled to a common base bias voltage and whose collectors are coupled via the smoothing filter to both the first and the second combining stage, said smoothing filter being provided with a capacitance arranged between the two collectors and a pair of collector resistors arranged in the collector leads of the transistor pair.

When using this measure, the pair of rectifier diodes is fed in a simple manner with mutually equal diode bias currents and the smoothing filter reduces the requirements imposed on the combining stages for a correct combination of the half-wave rectified signals.

Figure 2:
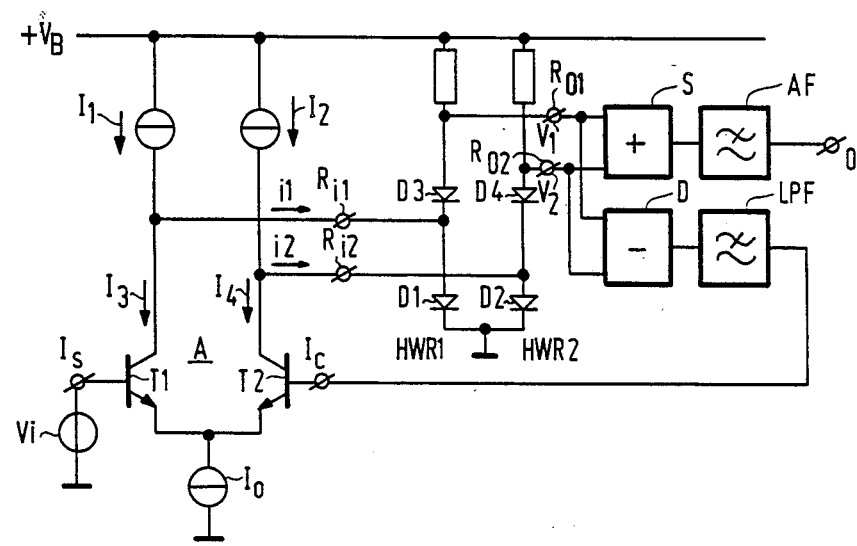

The invention will now be described in greater detail by way of example with reference to the accompanying drawings in which FIGS. 1A and 1B show detection characteristic curves of a half-wave rectifier, one curve being correct and one being disturbed, respectively, by an unwanted d.c. offset and non-linearity, FIG. 2 shows a circuit diagram of an envelope detector according to the invention, FIG. 3 shows an integrable, practical embodiment of an envelope detector according to the invention.

FIG. 2 shows a circuit diagram of an envelope detector according to the invention, comprising a cascade circuit of a differential amplifier A having a signal input $I_s$ and a control input $I_c$, a pair of half-wave rectifier circuits HWR1 and HWR2 with input and output terminal pairs $R_{i1}$, $R_{i2}$ and $R_{o1}$, $R_{o2}$, respectively, a first combining stage S and a smoothing filter AF having an output O with the envelope detector in common. The envelope detector also comprises a frequency-dependent negative feedback loop having a second combining stage D coupled to the said output terminal pair $R_{o1}$, $R_{o2}$ of HWR1 and HWR2, an output of said stage being connected via a low-pass filter LPF to the control input $I_c$ of the differential amplifier A.

The differential amplifier A has an emitter-coupled transistor pair T1, T2 whose bases are coupled to the signal input $I_s$ and the control input $I_c$, respectively, and whose collectors are coupled to the input terminal pair $R_{i1}$, $R_{i2}$ of the half-wave rectifier circuits HWR1 and HWR2, respectively. The common emitter tail of the transistor pair T1, T2 comprises a current source conveying a current $I_o$ and collector current sources conveying mutually equal currents $I_1$ and $I_2$, respectively, are incorporated between the collector of each of the transistors T1 and T2 and a power supply voltage. With a suitably chosen working point for T1 and T2, their collector currents $I_3$ and $I_4$ in the quiescent state are equal to $I_1$ and $I_2$, respectively. The sum of $I_1$ and $I_2$ and hence the sum of $I_3$ and $I_4$ is chosen to be equal to $I_o$. Consequently, an unbalanced input voltage $V_i$ applied to the signal terminal $I_s$ and comprising a carrier amplitude-modulated modulation signal is converted into a balanced pair of output currents, which have substantially the same form as $V_i$, at $R_{i1}$ and $R_{i2}$, that is to say, a pair of signal currents $i_1$ and $i_2$ which are in phase opposition in which substantially no in-phase common-mode components occur.

HWR1 and HWR2 each have a supply resistor coupled to the power supply voltage and two diodes (D3, D1 and D4, D2, respectively) operating as half-wave rectifiers which are series-arranged in the direction of conductivity between the supply resistor and ground. D1 and D2 of HWR1 and HWR2 constitute a diode pair whose cathodes are connected to ground and whose anodes, in common with the cathodes of D3 and D4, are connected to $R_{i1}$ and $R_{i2}$, respectively. The anodes of D3 and D4 are connected to $R_{o1}$ and $R_{o2}$, respectively. By means of suitably chosen values of the said supply resistors of HWR1 and HWR2 the diode pairs D1, D3 and D2, D4 are maintained just conducting in the quiescent state. Consequently, a positive signal current $i_1$ at $R_{i1}$ is shortcircuited to ground via D1, while D3 is cut off. A signal voltage $v_1$ having a constant amplitude is then produced at $R_{o1}$. A negative signal current $-i_1$ at $R_{i1}$ cuts off D1 and renders D3 conducting so that $v_1$ proportionally follows the signal current $-i_1$ ($v_1 = -i_1 R_1$ in which R is the value of the relevant supply resistor), resulting in a half-wave rectification of $i_1$ in the negative polarity. In the same manner a positive signal current $i_2$ at $R_{i2}$ results in a constant signal voltage $v_2$ at $R_{o2}$ and a negative signal current $-i_2$ is proportionally followed by $v_2$. Also $i_2$ is then half-wave rectified in the negative polarity. Starting from an input voltage $V_i$ at $I_s$, which is, for example sinusoidal, $i_1$ and $i_2$ are in phase opposition in a substantially sinusoidal form so that $v_1$ and $v_2$ alternately have negative sine-halves.

Addition of the alternately occurring sine-halves of $v_1$ and $v_2$ with like polarity in the first combining stage S results in a full-wave rectified signal from which the desired baseband modulation signal is selected in the smoothing filter AF.

By subtracting the said sine-halves of $v_1$ and $v_2$ in the second combining stage D, a signal is obtained whose d.c. level represents the total occurring unwanted d.c. offset, that is to say the sum of the d.c. offset of the input signal $v_i$, that of the differential amplifier A and that of the half-wave rectifier circuits HWR1 and HWR2, which gives rise to distortion in the detected baseband modulation signal.

In the embodiment shown the form of the lastmentioned signal corresponds to the original (for example sinusoidal) form of the input signal $v_i$ or the inverse value thereof and the last-mentioned total d.c. offset is measured by means of a suitable low-pass selection of the output signal of the second combining stage D in the low-pass filter LPF. By negatively feeding back the d.c. level thus selected to the differential amplifier A via the control input $I_c$ in a suitable manner, the unwanted d.c. offset in $v_1$ and $v_2$ is automatically reduced. The distortion caused by this greatly reduced d.c. offset is acceptably small, also in the case of very small input signals. Since it is also possible to give the diodes a correct working point by means of very small bias currents while maintaining a correct operation of the half-wave rectifier circuits HWR1 and HWR2, the slewing effects caused by parasitic capacitances and the resultant non-linearities are negligibly small.

It stands to reason that in the case of a half-wave rectification (not shown) of $i_1$ and $i_2$ with opposite polarity, that is to say, $v_1$ has positive sine-halves and $v_2$ has negative sine-halves or conversely, the first combining stage S is to realize a subtracting operation and the second combining stage D is to realize an adding operation to obtain the baseband modulation signal and the said automatic d.c. level reduction, respectively.

FIG. 3 shows a practical embodiment of the envelope detector according to the invention, which is suitable for integrated realization and in which the elements corresponding to those of FIG. 2 have the same reference designations.

In order to realize a linear, broad-band signal processing, the differential amplifier A is provided with degeneration resistors R1 and R2 in the emitter leads of T1 and T2. In order to obtain an accurate equality between the sum of the currents i and i and the sum of the currents $I_1$ and $I_2$, the mutually equal currents $I_1$ and $I_2$ on the one hand and $I_o$ on the other hand are derived via current mirror circuits from one and the same current reference $I_{ref}$ and the base currents of T1 and T2 are compensated by first and second input stages each of which comprise an emitter-coupled transistor pair T11, T12 and T13, T14, respectively, with & transistors T17 and T19, respectively, functioning as a tail current source in the common emitter tail. The bases of T11 and T14 are connected to the inputs $I_s$ and $I_c$, respectively, of A, whilst the base of T14 is connected to ground via a suitably chosen base voltage bias resistor R12.

The collectors of T11 and T14 are connected to the power supply voltage. The bases of T12 and T13 are connected to the emitters of T1 and T2 while the collectors of T12 and T13 are coupled to the bases of T1 and T2, respectively, and are fed with mutually equal collector currents from transistors T5 and T6 of a current mirror circuit T3–T10 to be described hereinafter. By adjusting these collector currents of T12 and T13 to a value which is equal to that of $I_1$ and $I_2$, respectively, and by adjusting the collector currents of T17 and T19 to a value which is equal to that of $I_o$, the base currents of T1 and T2 are compensated by those of T12 and T13, respectively, and the sum of $I_1$ and $I_2$ is accurately equal to that of $I_3$ and $I_4$.

Such a current adjustment is obtained by means of interconnected current mirror circuits T3–T10 and T15–T20 supplying a number of currents related to a reference current $I_{ref}$. To this end the current mirror circuit T3–T10 comprises PNP transistors T3 to T9 whose bases are interconnected and whose emitters are connected to the power supply voltage via respective emitter resistors R3 to R9. The emitter-base diode of a PNP transistor T10 is arranged anti-parallel across the base-collector diode of a transistor T9 functioning as an &input transistor of the current mirror circuit, and the collector of T10 is connected to ground. The common connection between the base of T10 and the collector of T9 is connected to ground via a resistor R10. The current through R10 can be adjusted to a suitable value by means of a correct ratio between R10 and R9 and functions as a reference current for the collector currents of T3 to T8. T10 then compensates the base currents of T3 to T9.

The collectors of the transistors T3–T6 are connected to those of the transistors T1, T2, T12 and T13, respectively, and supply mutually equal currents in the case of mutually equal emitter resistors R3–R6. The collector current of T7 is applied as a reference current via a resistor R11 to the afore-mentioned current mirror circuit T15–T20. This circuit comprises transistors T16 to T20 whose bases are interconnected and whose emitters are connected to ground via respective emitter resistors R16 to R20. The base-emitter diode of a transistor T15 is arranged anti-parallel across the base-collector diode of a transistor T16 functioning as an input transistor of the current mirror circuit, whilst the common node between the base of T15 and the collector of T16 is connected to R11. T15 compensates the base currents of T16 to T20. The so-called Early effect is minimized by a suitable choice for R11.

A current bias is obtained by suitably chosen emitter resistors R7, R16–R19 and emitter surface of the transistors T7, T15–T19, wherein $I_o=2I_1=2I_2$, or $I_o=I_1+I_2$ and the envisaged equality between the sum of $I_1$ and $I_2$ on the one hand and the sum of $I_3$ and $I_4$ occurs on the other hand so that the so-called common mode component in the signal currents $i_1$ and $i_2$ at $R_{i1}$ and $R_{i2}$, respectively, is negligibly small.

The half-wave rectification in HWR1 and HWR2 is realized by means of a transistor T21 whose base-emitter diode fulfils the function of the diode D3 in FIG. 1, together with the diode D1 series-arranged therewith and a transistor T22, respectively, whose base-emitter diode fulfils the function of the diode D4 together with the diode D2 arranged in series therewith. The current bias of T21 and T22 is chosen to be such that in the quiescent state T21 and T22 and D1 and D2 are just in the conducting state. To this end the bases of T21 and T22 are coupled in common to the emitter of a transistor T23 of a current bias circuit T23–T26, D5–D7.

The said current bias circuit comprises a series diode circuit incorporating three series-arranged diodes D5–D7, which circuit is arranged in the direction of conductivity between the base of T23 and ground to which a bias current is applied from the transistor T8 of the current mirror circuit T3–T10. The transistor T23 is arranged in cascode via the collector with a transistor T24 coupled to the power supply voltage and via the emitter to the transistor T20 of the current mirror circuit T15–T20. A current mirror circuit T25, T26 incorporated between the power supply voltage and the bases of T23 and T24 compensates the base current of T23 so that the currents $I_5$ and $I_6$ through T21 and D1 and T22 and D2, respectively, are accurately equal to $I_8/I_7$ in which $I_8$ is the current through the diode circuit D5–D7 and $I_7$ is the collector current of T20.

The output terminal pair $R_{o1}$ and $R_{o2}$ at HWR1 and HWR2 is constituted by the collectors of T21 and T22 and is arranged in cascode via the smoothing filter AF to input transistors T27 and T31, respectively, of PNP current mirror circuits T27–T30 and T31–T34.

The smoothing filter AF comprises a capacitor C1 arranged between $R_{o1}$ and $R_{o2}$ and mutually equal resistors R13 and R14 incorporated in the collector leads of T21 and T22. High-frequency components in the signals applied to T27 and T31 are reduced via C1 in such a manner that non-linearities in the further signal processing in T27 and T31 and in the subsequent first and second combination stages S and D, as well as the occurrence of parasitic feedback effects via the power supply line are prevented.

The half-wave rectified signal currents applied to the input transistors T27 and T31 are mirrored and are available at the collectors of output transistors T28 and T29 of the current mirror circuits T27–T30, and T32 and T33, of the current mirror circuit T31–T34, respectively. To this end the bases of T27–T29 and T30–T33 are interconnected and the emitters of T27–T29 and T30–T33 are connected to the power supply voltage via mutually equal emitter resistors. The base currents of T27 to T29 and T31 to T33 are compensated by means of transistors T30 and T34, whose emitter-base diodes are arranged anti-parallel across the collector-base diodes of T27 and T31, respectively, and whose collectors are connected to ground.

The output transistors T29 and T33 also constitute a part of the adder stage S and are connected to ground via a common collector resistor R33. The voltage across R33 presents the sum of the signal currents which are half-wave rectified with like polarity, supplied via R13 and R14 and selected by the smoothing filter AF, and becomes available as an output signal at the output O.

The output transistors T28 and T32 form part of the subtractor stage D and are coupled to NPN transistors T35, T36, respectively, functioning as a current mirror. The transistors T35 and T36 are connected to ground via mutually equal emitter resistors R35 and R36, respectively, whilst the collector-base diode of T36 is short-circuited and the collectors of T28 and T35 are coupled in common to the lowpass filter LPF. Since the collector current of T35 is substantially equal to that of T32, the difference of the currents supplied by T28 and T32 is applied to the low-pass filter LPF, that is to say, the difference of the signal currents which are half-wave rectified in mutually equal polarity and which are selected by the smoothing filter AF. The low-pass filter LPF has a capacitor C2 arranged between the collectors of T28 and T35 on the one hand, and ground on the other hand and a series resistor R15 which is coupled to the control input $I_c$ of the differential amplifier A. The gain of the d.c. control loop thus obtained is substantially equal to the quotient of the value of R12 on the one hand and the sum of the two emitter resistors $R_1+R_2$ of the differential amplifier A on the other hand and is adjusted to 10 in a practical embodiment. At a carrier frequency of more than 5 MHz a capacitance of 10 pF for C2 is sufficient at this value in order to obtain a sufficiently large suppression of unwanted signal frequency components in the d.c. control signal applied to $I_c$ at a suitably chosen value for R15.

The invention is of course not limited to the embodiments shown, and partial functions thereof such as amplification, current biassing, current mirroring and signal combining by means of alternative circuits can be realized. It is also possible to effect a signal inversion prior to signal combining whereby the first and second combining circuits S and D exchange their function.

What is claimed is:

1. An envelope detector comprising a differential amplifier, a full-wave rectifier circuit and a smoothing filter, said differential amplifier converting an input voltage into a pair of current signals in phase opposition, said full-wave rectifier circuit comprising a pair of half-wave rectifiers for half-wave rectifying the said pair of current signals and furnishing respective half-wave rectifier output signals corresponding to the so-rectified current signals, and a first combining stage coupled to said full-wave rectifier circuit for combining said half-wave rectifier output signals with like polarity, characterized by a frequency-dependent negative feedback loop which has a second combining stage coupled to the outputs of the pair of half-wave rectifiers for combining said half-wave rectifier output signals with opposite polarity, said second combining stage being negatively fed back to the differential amplifier via a low-pass filter for a selection of the d.c. component.

2. An envelope detector as claimed in claim 1, characterized in that the pair of half-wave rectifiers is constituted by a diode pair which is arranged in the direction of conductivity between a pair of current outputs of the differential amplifier and ground, and whose diodes are fed with mutually equal diode bias currents.

3. An envelope detector as claimed in claim 1, characterized in that the differential amplifier comprises a transistor pair whose bases are coupled to an input terminal pair of the differential amplifier, whose emitters are connected via first and second emitter resistors, respectively, to a common emitter current source and whose collectors are coupled via first and second collector current sources, respectively, to a power supply voltage and to the pair of half-wave rectifiers, said current sources being coupled via a current mirror arrangement to a common reference current, said current mirror arrangement comprising a current bias circuit for biasing the current of the emitter current source at the sum value of the currents of the said two collector current sources.

4. An envelope detector as claimed in claim 2, characterized by a transistor pair whose emitters are coupled to the diodes of the said diode pair, whose bases are coupled to a common base bias voltage and whose collectors are coupled via the smoothing filter to both the first and the second combining stage, said smoothing filter being provided with a capacitance arranged between the two collectors and a pair of collector resistors arranged in the collector leads of the transistor pair.

* * * * *